(12) United States Patent
Havens

(10) Patent No.: US 7,274,192 B2
(45) Date of Patent: Sep. 25, 2007

(54) COMBINED OPEN AND CLOSED MAGNET CONFIGURATION FOR MRI

(75) Inventor: Timothy John Havens, Florence, SC (US)

(73) Assignee: General Electric Company, Schenectady, NY (US)

(*) Notice: Subject to any disclaimer, the term of this patent is extended or adjusted under 35 U.S.C. 154(b) by 67 days.

(21) Appl. No.: 10/908,893

(22) Filed: May 31, 2005

(65) Prior Publication Data

US 2006/0267585 A1 Nov. 30, 2006

(51) Int. Cl.
*G01V 3/00* (2006.01)
*H01F 5/00* (2006.01)

(52) U.S. Cl. .................. 324/319; 324/320; 324/318; 335/299; 335/296

(58) Field of Classification Search .............. None
See application file for complete search history.

(56) References Cited

U.S. PATENT DOCUMENTS

| | | | | |
|---|---|---|---|---|
| 5,381,122 A | * | 1/1995 | Laskaris et al. | 335/299 |
| 5,389,909 A | | 2/1995 | Havens | 335/218 |
| 5,495,222 A | * | 2/1996 | Abele et al. | 335/306 |
| 5,696,476 A | | 12/1997 | Havens | 335/218 |
| 5,798,680 A | * | 8/1998 | Abele et al. | 335/301 |
| 5,883,558 A | | 3/1999 | Laskaris | 335/216 |
| 5,935,065 A | * | 8/1999 | Rose et al. | 324/318 |
| 5,936,498 A | * | 8/1999 | Takeshima et al. | 335/216 |
| 5,994,991 A | | 11/1999 | Laskaris | 335/299 |
| 6,029,081 A | * | 2/2000 | DeMeester et al. | 600/410 |
| 6,084,497 A | | 7/2000 | Crozier | 335/299 |
| 6,100,780 A | | 8/2000 | Dorri | 335/216 |
| 6,140,900 A | | 10/2000 | Crozier | 335/299 |
| 6,147,579 A | * | 11/2000 | Einziger et al. | 335/299 |
| 6,154,110 A | * | 11/2000 | Takeshima | 335/299 |
| 6,157,279 A | | 12/2000 | Laskaris | 335/299 |
| 6,201,462 B1 | | 3/2001 | Laskaris | 335/299 |
| 6,265,959 B1 | * | 7/2001 | Abele et al. | 335/299 |
| 6,333,630 B1 | * | 12/2001 | Holsinger et al. | 324/319 |
| 6,462,548 B1 | * | 10/2002 | Havens | 324/318 |
| 6,504,461 B2 | | 1/2003 | Huang | 335/296 |
| 6,580,346 B1 | * | 6/2003 | Takeshima et al. | 335/216 |
| 6,642,826 B1 | * | 11/2003 | Aoki et al. | 335/299 |
| 6,677,753 B1 | | 1/2004 | Danby | 324/318 |
| 6,781,495 B2 | * | 8/2004 | Aoki et al. | 335/301 |
| 6,933,722 B2 | * | 8/2005 | Tsuda et al. | 324/318 |
| 2003/0020578 A1 | * | 1/2003 | Aoki et al. | 335/299 |

(Continued)

OTHER PUBLICATIONS

Stewart C. Bushong textbook: Magnetic Resonance Imaging physical and Biological Principles Second Edition p. 159 the last two full sentences (i.e. the first page of chapter 13) published in 1996.*

*Primary Examiner*—Brij Shrivastav
*Assistant Examiner*—Tiffant A. Fetzner
(74) *Attorney, Agent, or Firm*—Cantor Colburn LLP

(57) ABSTRACT

A magnetic resonance imaging (MRI) magnet having a first section and a second section is disclosed. The first section has a first housing, and a first set of magnet coils arranged about a common axis that include coils proximate the common axis. The second section has a second housing, and a second set of magnet coils arranged about the common axis where the coils are radially displaced from the common axis. The second section is connected to but axially displaced a distance "d" from the first section.

25 Claims, 3 Drawing Sheets

U.S. PATENT DOCUMENTS

2003/0155998 A1* 8/2003 Takeshima et al. ......... 335/299
2004/0251901 A1* 12/2004 Tsuda et al. ................ 324/318
2006/0006866 A1* 1/2006 Roozen et al. .............. 324/318

* cited by examiner

COMBINED OPEN AND CLOSED MAGNET CONFIGURATION FOR MRI

BACKGROUND OF THE INVENTION

The present disclosure relates generally to magnetic resonance imaging (MRI), and particularly to a magnet suitable for MR guided interventional procedures.

Magnetic resonance (MR) guided interventional procedures have the potential of providing significant benefit to a patient, such as where tumor resections leave behind tumor tissue that may be removed with MR guidance. Minimally invasive techniques, such as MR guidance and therapy monitoring for laser, RF (radio frequency) and cryo ablation, may benefit the patient by saving the patient from a more invasive surgery that has a longer associated recovery time. However, present cylindrical magnets and open magnets have restricted access for such MR guided interventional procedures. Full size double-donut magnet configurations may provide increased physician access, but they have been limited to 0.5 T (Tesla) with a limited SNR (signal to noise ratio) and limited applications. As medical advances are made, minimally invasive surgeons are looking for apparatus and techniques that allow them to image fiber bundles in the brain during surgery to avoid damage to these areas during the surgery. With present 0.5 T magnets, this application cannot be completed in a timely fashion. In addition, access between the magnet halves does not allow enough room for physician assistants. In other areas, MR guidance may be used for insertion of catheters for biopsy extraction or introduction of stents. In many of these applications, a relatively small field of view (FOV) is sufficient for the intervention if the patient can be moved to keep the patient's anatomy of interest within the homogeneous region.

Accordingly, there is a need in the art of MR guided interventional procedures for a MRI magnet that overcomes the aforementioned drawbacks and provides additional advantages.

BRIEF DESCRIPTION OF THE INVENTION

Embodiments of the invention include a magnetic resonance imaging (MRI) magnet having a first section and a second section. The first section has a first housing, and a first set of magnet coils arranged about a common axis that include coils proximate the common axis. The second section has a second housing, and a second set of magnet coils arranged about the common axis where the coils are radially displaced from the common axis. The second section is connected to but axially displaced a distance "d" from the first section.

Other embodiments of the invention include a magnetic resonance imaging (MRI) magnet having a closed magnet and an open ring-shaped magnet. The closed magnet has a first housing, and a first set of magnet coils arranged about a common axis that includes coils proximate the common axis. The open ring-shaped magnet has a second housing, and a second set of magnet coils arranged about the common axis where the coils are radially displaced from the common axis, thereby providing an axial opening to allow end access to an object disposed between the closed and open magnets. The open magnet is connected to but axially displaced a distance "d" from the closed magnet via a set of supports that provide openings to allow side access to the object disposed between the closed and open magnets.

Further embodiments of the invention include a magnetic resonance imaging (MRI) system having a MRI magnet, and a control system for controlling the operation of the MRI magnet such that MRI data of an object may be generated and saved for subsequent post-processing and analysis. The MRI magnet has a first section and a second section. The first section has a first housing, and a first set of magnet coils arranged about a common axis that include coils proximate the common axis. The second section has a second housing with an axial opening therethrough, and a second set of magnet coils arranged about the common axis where the coils are radially displaced from the common axis. The second section is connected to but axially displaced a distance "d" from the first section via a set of supports with side openings therebetween. Side access through the side openings and end access through the axial opening is allowed to an object disposed between the two sections.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention provides a lower magnet section that contains most of the electromagnetic coils and shielding, and a smaller, open upper magnet section connected to the lower section, thereby allowing top and side access to a patient disposed between the two sections.

In an embodiment, the upper section of the magnet is donut-shaped or ring-shaped with access for interventional procedures through the donut section, and the lower section of the magnet is closed and may have magnetic material such as iron included for achieving better stray field at lower cost. Access is provided all around the magnet except where obstructed by posts that hold the two magnet sections apart. Ease of patient movement enables the anatomy of interest to be kept in the homogeneous region of the magnet.

In alternative embodiments, the distance between the upper and lower magnet sections may be large or small, depending on the application, and active shielding may be employed in the upper and lower sections. As previously mentioned, active shielding may be replaced by iron, with a significant quantity of iron being added to lower magnet section for improved stray field management.

Figure 1:
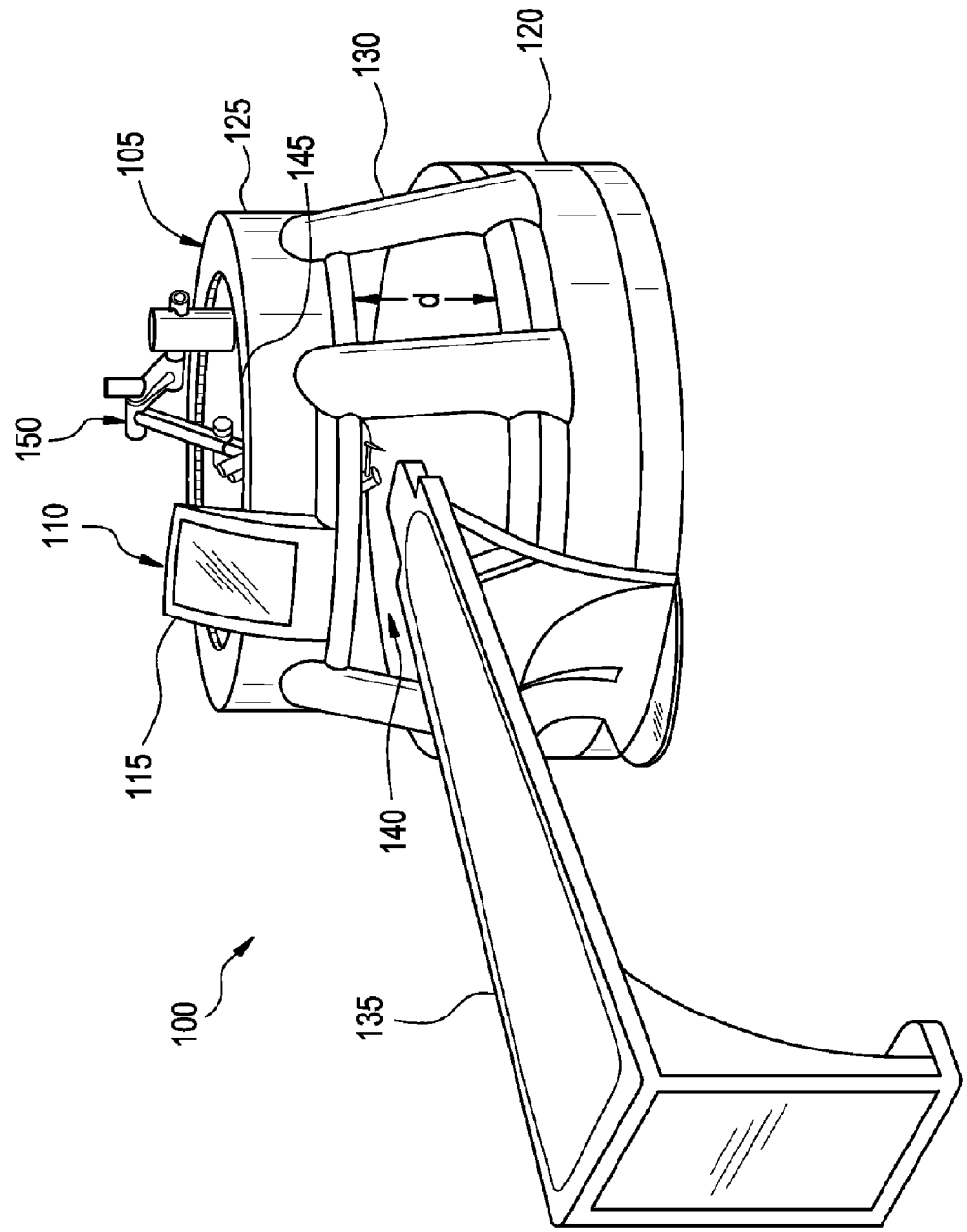
FIG. 1 depicts in isometric view an exemplary magnetic resonance imaging (MRI) system having a magnet in accordance with an embodiment of the invention.

Referring now to FIG. 1, an exemplary embodiment of a magnetic resonance imaging (MRI) system 100 is depicted having a MRI magnet 105 and a control system 110 for the control and operation thereof. In an embodiment, control system 110 includes a console 115 for controlling x, y and z-axis gradient magnetic field power supplies (not specifically shown) for powering magnet 105, as well as transmit and receive circuitry (specifically shown) for controlling the RF pulses to RF coils (not specifically shown). Console 115 also provides overall control for processing and displaying the nuclear magnetic resonance signals during a MR guided interventional procedure.

In an embodiment, magnet 105 includes a lower (first) section 120 and an upper (second) section 125, separated by a distance "d" via supports 130. A table 135 enables a patient (not specifically shown) to be moved between supports 130 via one of several side openings 140 into the region between lower 120 and upper 125 sections. The upper section 125 of magnet 105 is configured with a central opening 145. Openings 140 and 145 provide access to the patient for equipment, such as interventional apparatus (physician robotic arm for example) 150, and for physicians and other interventional personnel.

Figure 2:
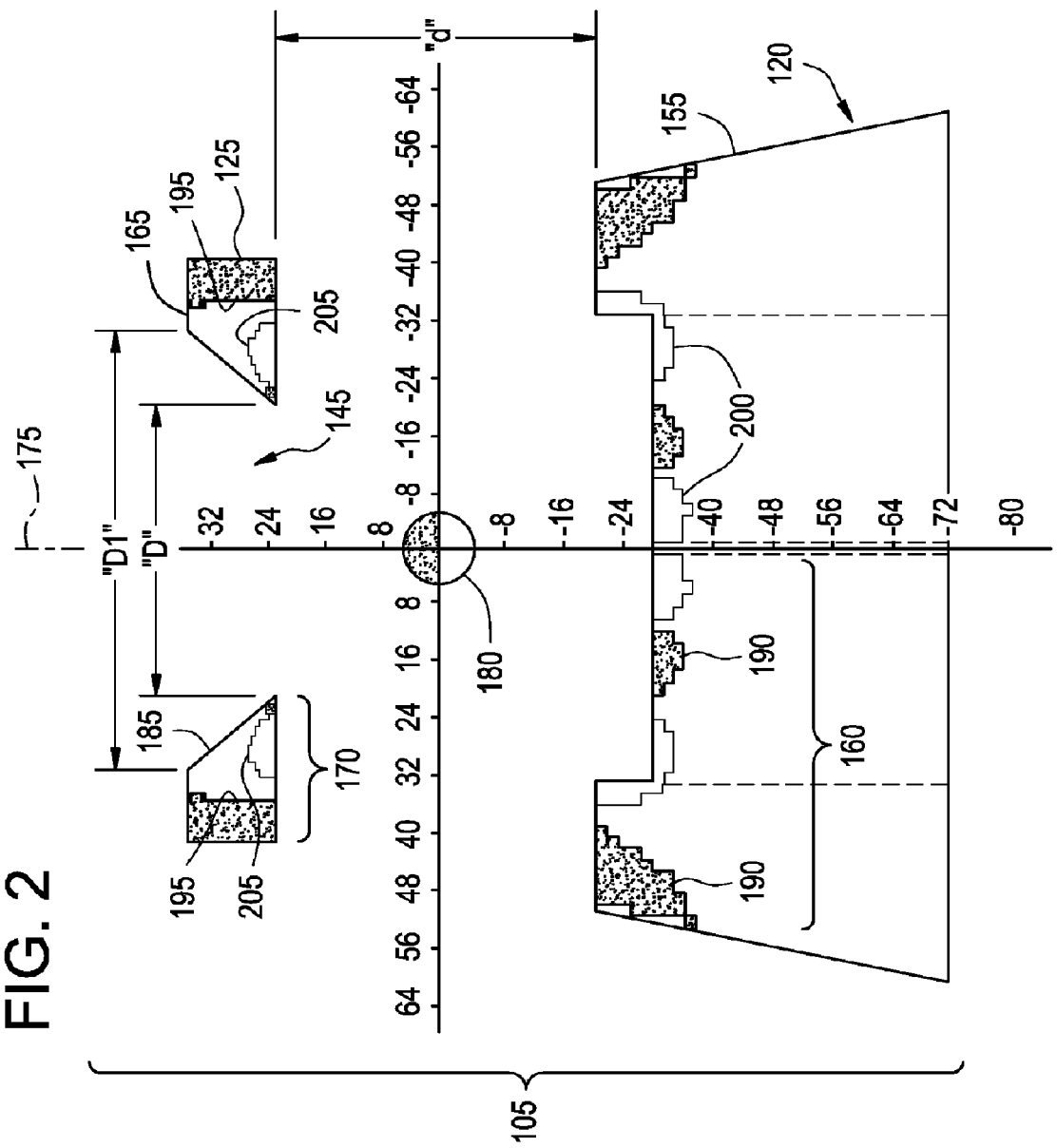
FIG. 2 is illustrative of simulation model information, depicted in axisymmetric cross section view, relating to the magnet of FIG. 1, showing coil placement and a resultant field of view in accordance with an exemplary embodiment of the invention.

Referring now to FIG. 2, an exemplary magnet 105 is shown in cross section view having lower section 120 with a first housing 155 and a first set of magnet coils 160, and upper section 125 with a second housing 165 and a second set of magnet coils 170. More specifically, FIG. 2 is illustrative of simulation model information of an exemplary magnet 105, depicted in axisymmetric cross section view, showing coil placement and a resultant field of view 180, which will be discussed in more detail below. The first 160 and second 170 set of magnet coils are arranged about a common axis 175. The first set of magnet coils 160 include coils proximate the common axis 175, while the second set of magnet coils 170 are radially displaced from the common axis, thereby providing the central (axial) opening 145 in the upper section 125. As illustrated in FIG. 2, an embodiment of magnet 105 includes upper section 125 being displaced a distance "d" from lower section 120 where "d" is on the order of about 44 centimeters, and includes axial opening 145 having a diameter "D" on the order of about 40 centimeters. More generally, however, distance "d" is sized sufficiently to receive a human head, body, or portion of the body, for undergoing a MR guided interventional procedure, and diameter "D" is sized sufficiently to receive a human arm or a physician robotic arm for practicing a MR guided interventional procedure.

The arrangement of coils 160 and 170 is such that in response to magnet 105 being energized, a field of view (FOV) 180 is established on the common axis 175 and within the region defined by distance "d" between the lower 120 and upper 125 sections. In an embodiment, magnet 105 has been simulated as being capable of generating a field strength of about 1.5 Tesla, with a FOV 180 that is on the order of about 10 centimeters in diameter, as illustrated in FIGS. 2 and 3.

Figure 3:
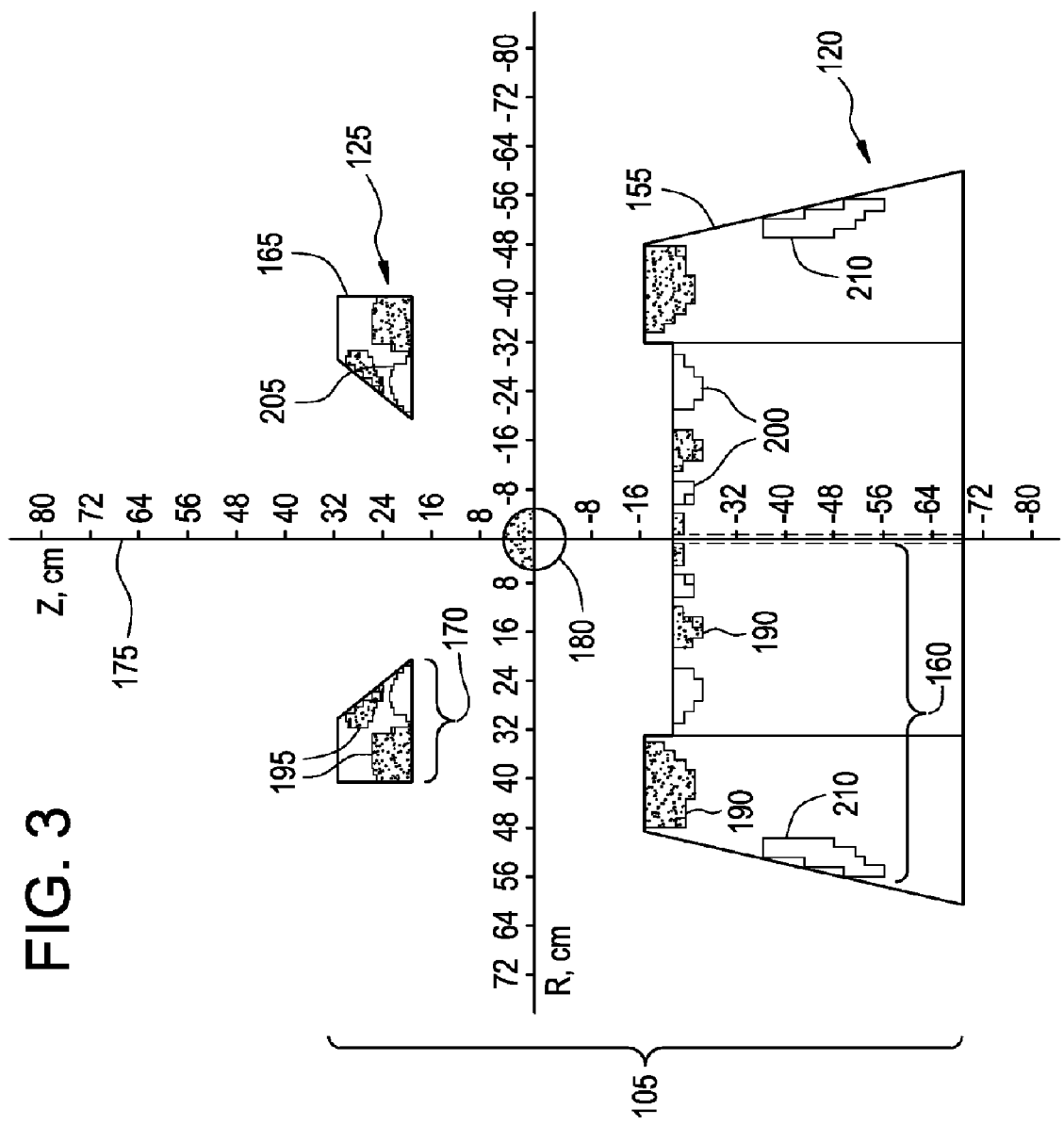
FIG. 3 depicts an alternative embodiment to that of FIG. 2.

FIG. 3 illustrates an alternative embodiment of magnet 105 where "d" is on the order of about 38 centimeters. In an embodiment, distance "d" is equal to or greater than about 30 centimeters and diameter "D" is equal to or greater than about 30 centimeters, and in another embodiment, distance "d" is equal to or greater than about 40 centimeters.

Still referring to FIG. 2, an embodiment of magnet 105 is configured such that upper section 125 has a cross section that reduces in size with an increasing distance from the lower section 120, as evidenced by the sloped surface 185 that transitions from diameter "D" to diameter "D1", where "D1" is greater than "D". By increasing the opening 145 from bottom to top, improved viewing and access to a patient is possible by a physician standing on the side of magnet 105.

In an embodiment, the first 160 and second 170 sets of magnet coils include primary (main) coils 190, 195, compensation (negative correction or negative field focusing) coils 200, 205, and active shielding coils 210 (best seen by referring to FIG. 3). In an alternative embodiment, shim coils and B0 coils (not shown) may also be employed.

In an alternative embodiment, some shielding coils 210 in lower section 120 (see FIG. 3) may be replaced by iron in sufficient quantity to effect stray field management. While certain arrangements of primary, compensation, shielding coils and iron are depicted, it will be appreciated that other arrangements may also be employed in accordance with the teachings disclosed herein.

As previously discussed, and as illustrated in FIGS. 2 and 3, first set of magnet coils 160 include coils proximate the common axis 175, while the second set of magnet coils 170 are radially displaced from the common axis. As such, the lower section 120 of magnet 105 is referred to as a closed magnet, and the upper section 125 is referred to as an open magnet.

While embodiments of the invention have been described and illustrated employing defined dimensions and coil layout, it will be appreciated that this is by way of illustration and not limitation, that the scope of the invention is not limited to only those dimensions and layouts specifically described and illustrated, and that the invention may also apply to a magnet having larger or smaller dimensions, and alternative coil layouts, depending on the desired application.

As disclosed, some embodiments of the invention may include some of the following advantages: a magnet for MR guided interventional procedures having a closed bottom and an open top, which is capable of delivering higher field strength at lower cost as compared to existing MR guided interventional systems; a magnet for MR guided interventional procedures that provide a physician with access to an imaging volume of 10 centimeters or more at a field strength of 1.5 Tesla, and at a reasonable cost; a magnet for a MR guided interventional system that is capable of producing a 1.5 Tesla field strength, which provides significant benefit over an existing 0.5 Tesla interventional system; and, a magnet for a MR guided interventional system that enables physicians and their assistants to stand around the magnet while having access to a patient undergoing treatment, which is a significant benefit in surgical applications.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A magnetic resonance imaging (MRI) magnet, comprising:

a lower first section of a magnet having a first housing and a first set of magnet coils arranged about a common axis, the first set of magnet coils including coils proximate the common axis; and an upper second section of the magnet having a second housing and a second set of magnet coils arranged about the common axis, the second set of magnet coils being radially displaced from the common axis;

wherein the upper second section of the magnet is connected to but axially displaced a distance "d" from the lower first section of the magnet;

wherein the lower first section of the magnet is a closed magnet; and wherein the upper second section of the magnet is an open magnet;

wherein the upper second section of the magnet is ring-shaped thereby providing an axial opening in order to allow unobstructed end access to an object disposed between the lower first and upper second sections of the magnet; and wherein the upper second section of the magnet is connected to the lower first section of the magnet via a set of supports that provide openings in order to allow unobstructed side access to an object disposed between the lower first and upper second sections of the magnet.

2. The magnet of claim 1, wherein: in response to an energized magnet, a field of view is established within the distance "d".

3. The magnet of claim 1, wherein: in response to an energized magnet, a field of view is established on the common axis.

4. The magnet of claim 1, wherein the second upper section of the magnet is smaller in diameter than the lower first section of the magnet.

5. The magnet of claim 1 for examination of a patient, wherein the distance "d" is so dimensioned as to receive means for inserting the patient therethrough.

6. The magnet of claim 1, wherein: the inner diameter of the upper second section of the magnet increases with an increasing distance from the lower first section of the magnet.

7. The magnet of claim 1, wherein:
the first set of magnet coils comprises a primary coil, a compensation coil, a shielding coil, or any combination comprising at least one of the foregoing coils; and
the second set of magnet coils comprises a primary coil, a compensation coil, a shielding coil, or any combination comprising at least one of the foregoing coils.

8. The magnet of claim 1, wherein: the lower first section of the magnet comprises iron sufficient to effect stray field management.

9. The magnet of claim 1, wherein: the lower first section of the magnet, the upper second section of the magnet, or both lower first and upper second sections of the magnet comprises iron sufficient to effect magnetic field homogeneity at a field of view.

10. The magnet of claim 1, wherein: the distance "d" is sufficient to receive a human head.

11. The magnet of claim 1, wherein: the distance "d" is equal to or greater than about 30 centimeters.

12. The magnet of claim 1, wherein: the distance "d" is equal to or greater than about 40 centimeters.

13. The magnet of claim 1, wherein: the axial opening of the upper second section of the magnet has a diameter sufficient to receive a human arm.

14. The magnet of claim 1, wherein: the axial opening of the upper second section of the magnet has a diameter equal to or greater than about 30 centimeters.

15. The magnet of claim 1, wherein: the cross section of the upper second section of the magnet reduces in size with an increasing distance from the lower first section of the magnet.

16. A magnetic resonance imaging (MRI) magnet, comprising:

a first closed magnet having a first housing and a first set of magnet coils arranged about a common axis, the first set of magnet coils including coils proximate the common axis;

a second open ring-shaped magnet having a second housing and a second set of magnet coils arranged about the common axis, the second set of magnet coils being radially displaced from the common axis thereby providing an axial opening within the ring-shaped magnet in order to allow unobstructed end access to an object disposed between the first closed and second open magnets; and the second open magnet being connected to but axially displaced a distance "d" from the first closed magnet via a set of supports that provide openings in order to allow unobstructed side access to the object disposed between the first closed magnet and second open ring-shaped magnets.

17. A magnetic resonance imaging (MRI) system, comprising:

a MRI magnet; and a control system configured for controlling the operation of the MRI magnet such that MRI data of an object may be generated and saved for subsequent post-processing and analysis;

wherein the MRI magnet comprises:

a lower first section of the magnet having a first housing and a first set of magnet coils arranged about a common axis, the first set of magnet coils including coils proximate the common axis, the lower first section of the magnet defining a closed magnet;

an upper second section of the magnet having a second housing with an unobstructed axial opening therethrough and a second set of magnet coils arranged about the common axis, the second set of magnet coils being radially displaced from the common axis, the upper second section of the magnet defining an open magnet;

the upper second section of the magnet being connected to but axially displaced a distance "d" from the lower first section of the magnet via a set of supports with more than two unobstructed side openings therebetween; and wherein unobstructed side access through the more than two side openings and unobstructed end access through the axial opening is provided to an object disposed between the lower first and upper second sections of the magnet.

18. An open MRI magnet assembly comprising:

a first closed ended magnet;

a second open ended magnet connected to the first closed ended magnet and having a volume defined therebetween, the second open ended magnet having an unobstructed end opening therethrough in order to allow access to the volume defined between the second open ended magnet and the first closed ended magnet;

a plurality of supports connecting the first closed ended magnet and the second open ended magnet;

wherein each of the plurality of supports has a height such that a passage is formed between the second open ended magnet and the first closed ended magnet in order to allow a subject to be removably positioned in the volume between the second open ended magnet and the first closed ended magnet; and wherein the plurality of supports is arranged circumferentially around the first closed ended magnet such that a number of more than two unobstructed side access openings is formed generally orthogonal to the unobstructed end opening of the second open ended magnet.

19. The open MRI magnet assembly of claim 18 wherein the unobstructed opening in the second open ended magnet is sized in order to allow unobstructed access of an interventional apparatus to a subject disposed in the volume between the second open ended magnet and the first closed ended magnet.

20. The open MRI magnet assembly of claim 18 wherein the second open-ended magnet is ring-shaped.

21. The open MRI magnet assembly of claim 18 wherein the first closed ended magnet comprises iron sufficient to effect stray field management.

22. The open MRI magnet assembly of claim 18 further comprising a first housing having the first closed ended magnet therein and a second housing having the second open ended magnet therein, and further comprising an operation control interface supported by one of the first housing and the second housing.

23. The open MRI magnet assembly of claim 18 configured to generate at least a 1.5 T magnetic field in the volume defined between the second open ended magnet and the first closed ended magnet.

24. The open MRI magnet assembly of claim 18 wherein each magnet includes at least one of a primary coil, a compensation coil, and a shielding coil.

25. The open MRI magnet assembly of claim 18, wherein the second open ended magnet is smaller in diameter than the first closed ended magnet.

* * * * *